United States Patent
Hamazaki

(10) Patent No.: US 7,397,256 B2
(45) Date of Patent: Jul. 8, 2008

(54) AUTOMATIC DESIGN METHOD FOR SEMICONDUCTOR DEVICE

(75) Inventor: Ryoji Hamazaki, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 11/348,493

(22) Filed: Feb. 7, 2006

(65) Prior Publication Data

US 2006/0267612 A1  Nov. 30, 2006

(30) Foreign Application Priority Data

May 30, 2005 (JP) .............................. 2005-157245

(51) Int. Cl.
*G01R 31/02* (2006.01)
(52) U.S. Cl. .......................................... 324/758; 716/12
(58) Field of Classification Search .................. 716/12; 324/758
See application file for complete search history.

(56) References Cited

U.S. PATENT DOCUMENTS

| | | | | |
|---|---|---|---|---|
| 4,202,007 A | * | 5/1980 | Dougherty et al. | 257/697 |
| 4,445,735 A | * | 5/1984 | Bonnefoy | 439/66 |
| 4,458,297 A | * | 7/1984 | Stopper et al. | 361/771 |
| 4,636,965 A | * | 1/1987 | Smith et al. | 716/12 |
| 5,155,577 A | * | 10/1992 | Chance et al. | 257/773 |
| 5,220,490 A | * | 6/1993 | Weigler et al. | 361/777 |
| 5,309,324 A | * | 5/1994 | Herandez et al. | 361/734 |
| 5,319,224 A | * | 6/1994 | Sakashita et al. | 257/203 |
| 5,490,040 A | * | 2/1996 | Gaudenzi et al. | 361/773 |
| 5,686,699 A | * | 11/1997 | Chu et al. | 174/542 |
| 5,740,069 A | * | 4/1998 | Agrawal et al. | 716/16 |
| 5,774,340 A | * | 6/1998 | Chang et al. | 361/771 |
| 5,784,262 A | * | 7/1998 | Sherman | 361/777 |
| 5,784,264 A | * | 7/1998 | Tanioka | 361/803 |
| 6,295,634 B1 | * | 9/2001 | Matsumoto | 716/12 |
| 6,594,811 B2 | * | 7/2003 | Katz | 716/12 |
| 6,836,002 B2 | * | 12/2004 | Chikawa et al. | 257/666 |
| 6,983,438 B1 | * | 1/2006 | Newman et al. | 716/8 |
| 7,095,107 B2 | * | 8/2006 | Ramakrishnan et al. | 257/691 |
| 7,146,596 B2 | * | 12/2006 | Bednar et al. | 716/12 |
| 2005/0044517 A1 | * | 2/2005 | Seaman et al. | 716/8 |

FOREIGN PATENT DOCUMENTS

| | | | |
|---|---|---|---|
| JP | 11272716 A | * | 10/1999 |
| JP | 2000-035986 | | 2/2000 |
| JP | 2000-100955 | | 4/2000 |

* cited by examiner

*Primary Examiner*—Jack Chiang
*Assistant Examiner*—Patrick Sandoval
(74) *Attorney, Agent, or Firm*—Rabin & Berdo, PC

(57) ABSTRACT

A positioning region of external terminals is divided into a plurality of positioning sections, and at least one side or perimeter of a chip is assigned to each positioning section. The external terminals in each positioning section are allocated to the perimeter to which the positioning section is assigned. The external terminals allocated to each perimeter are grouped into groups arranged perpendicularly to the perimeter, and pads of the chip are also grouped. The external terminals of the groups are assigned to the pads of the corresponding groups. The external terminals and the pads assigned to each other are connected by linear virtual wirings. Further, it is checked whether the virtual wirings cross each other. If there are crossing virtual wirings, the correspondences between the external terminals and the pads are replaced with each other.

5 Claims, 14 Drawing Sheets

AUTOMATIC DESIGN METHOD FOR SEMICONDUCTOR DEVICE

BACKGROUND OF THE INVENTION

This invention relates to an automatic design technique of a semiconductor integrated circuit, and in particular, relates to a technique for automatically positioning external terminals on a surface of a semiconductor chip having pads.

Recently, with the development of high-density and multi-functional semiconductor integrated circuits, the number of pads of a semiconductor integrated circuit and the number of external terminals (i.e., electrode pins) of the semiconductor package tend to increase. Therefore, the design work for determining the positions of the electrode pins and for wiring the electrode pins and the pads becomes complicated. Thus, there is an increasing demand for an automatic design technique.

In automatically positioning the electrode pins and wiring the electrode pins and the pads, it is preferable that the wire length can be short and the single-layer wiring can be used.

Conventional techniques for automatically wiring the electrode pins and the pads are disclosed in Japanese Laid-Open Patent Publication No. 2000-35986 (referred to as Patent Publication 1) and Japanese Laid-Open Patent Publication No. 2000-100955 (referred to as Patent Publication 2).

In Patent Publication 1, a region of a semiconductor chip on which the electrode pins are disposed is divided into four trapezoidal sections. The electrode pins of each trapezoidal region are connected to the pads disposed on a corresponding perimeter facing the trapezoidal region, in accordance with the predetermined order of priority (see paragraphs 0111 through 0120, FIGS. 6 through 9 and FIG. 12 of Patent Publication 1).

In Patent Publication 2, a common lead pattern is used for connecting a plurality of pads and a plurality of electrode pins. The automatic wiring is accomplished by placing the common lead pattern on a suitable position.

However, the techniques disclosed in Patent Publications 1 and 2 have following problems.

In the technique disclosed in Patent Publication 1, the number of the electrodes pins of each trapezoidal region needs to be the same as the number of the pads of the corresponding perimeter. Therefore, if the number of the pads varies from one perimeter to another, it becomes difficult to properly perform the wiring. As a result, many constraints are imposed on the design of the semiconductor integrated circuit.

In the technique disclosed in Patent Publication 2, the total number of the pads and the electrode pins needs to be an integral multiple of the wirings of the lead pattern, and therefore many constraints are imposed on the design of the semiconductor integrated circuit.

SUMMARY OF THE INVENTION

An object of the present invention is to provide an automatic design technique in which the wiring length can be short, the single-layer wiring can be used, and less constraints are imposed on the design of the semiconductor integrated circuit.

The present invention provides an automatic design method for automatically positioning external terminals of a semiconductor device. The external terminals are formed on a semiconductor chip having pads.

The automatic design method includes the steps of:
determining positioning sections of the external terminals by determining positions of the external terminals, dividing the positioning region into a plurality of positioning sections, and assigning at least one of the perimeters to each positioning section based on a positional relationship between the perimeters and the positioning sections;

determining allocated perimeters by allocating the external terminals in each positioning section to a corresponding perimeter to which the positioning section is assigned or to one of corresponding perimeters if a plurality of corresponding perimeters are assigned to the positioning section, until the number of the external terminals allocated to the perimeters reaches the number of the pads arranged along the perimeters, determining positioning columns by grouping the external terminals allocated to each perimeter into groups arranged in a direction perpendicular to the perimeter to which the external terminals are allocated, and grouping the pads arranged along each perimeter into groups according to the number of the external terminals of corresponding groups, starting from an endmost pad arranged along each perimeter, determining positioning rows by assigning the external terminals of the groups to the pads of corresponding groups; and editing positions of the external terminals by connecting the external terminals and the pads assigned to each other by means of linear virtual wirings, checking whether the virtual wirings cross each other, and replacing correspondences between the external terminals and the pads of crossing virtual wirings with each other if there are crossing virtual wirings.

DETAILED DESCRIPTION OF THE PREFERRED EMBODIMENT

Figure 1:
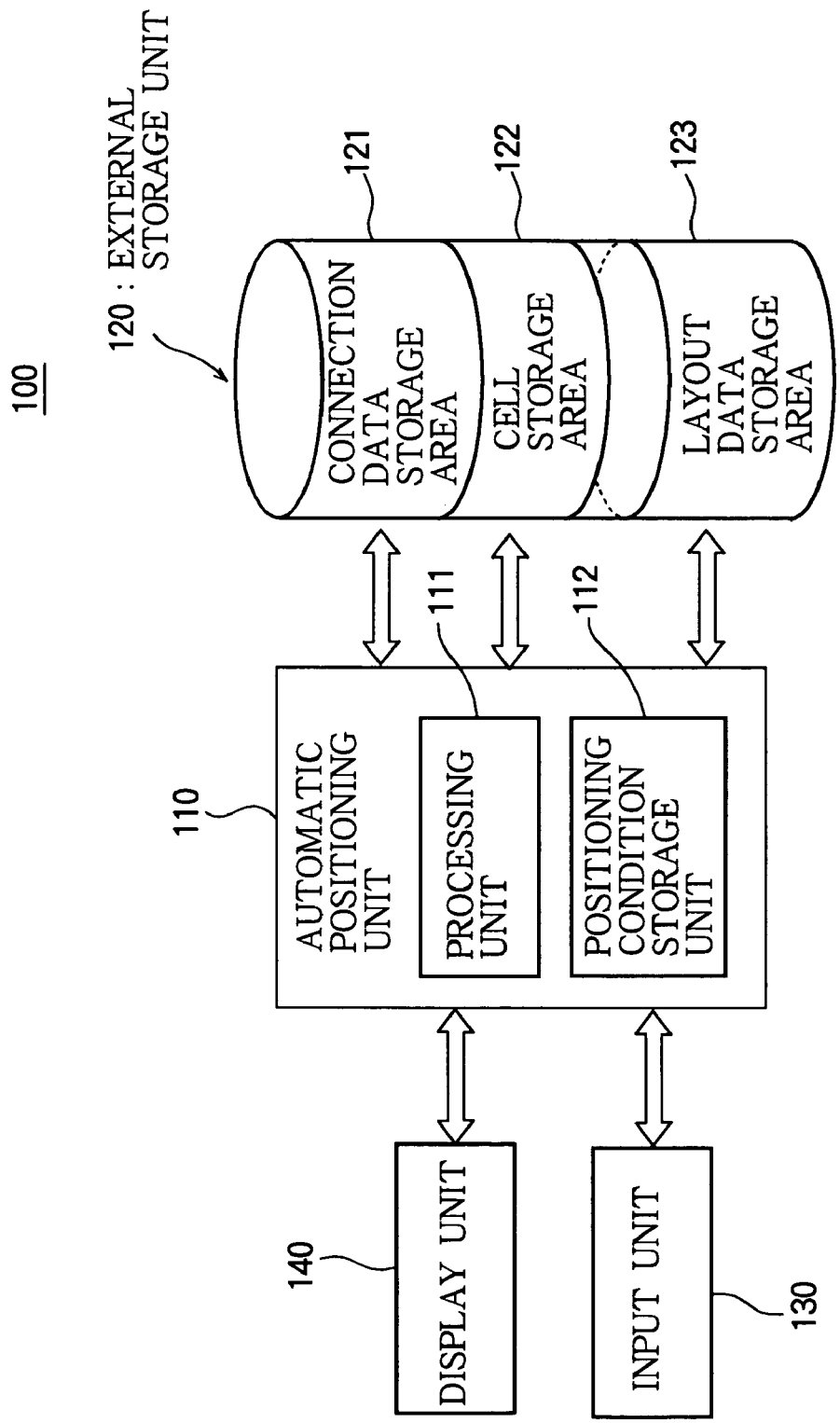
FIG. 1 is a block diagram schematically illustrating a configuration of an automatic design apparatus according to an embodiment of the present invention.

Embodiments of the present invention will be described with reference to the attached drawings. In the drawings, the size, shape and positional relationship of respective components are illustrated schematically to the extent that the present invention can be understood. The numerical conditions described below are merely example.

In this embodiment, the present invention is applied to the positioning of tower posts of Wafer Level Chip Size Package (W-CSP).

FIG. 1 is a block diagram schematically illustrating a configuration of an automatic design apparatus according to the embodiment of the present invention. As shown in FIG. 1, the automatic design apparatus 100 of the embodiment includes an automatic positioning unit 110, an external storage unit 120, an input unit 130 and a display unit 140.

The automatic positioning unit 110 is configured to automatically position the tower posts (i.e., external terminals). For this purpose, the automatic positioning unit 110 includes a processing unit 111 and a positioning-condition storage unit 112. The processing unit 111 is configured to perform an automatic positioning process of the tower posts described later. The positioning-condition storage unit 112 is configured to store data representing positioning conditions while the processing unit 111 is performing the automatic positioning process.

The external storage unit 120 is composed of, for example, a hard disk device or the like. The external storage unit 120 includes a connection data storage area 121, a cell storage area 122 and a layout data storage area 123. The connection data storage area 121 stores data representing identifying numbers of respective pads and identifying numbers of the respective tower posts, and data representing connections between the pads and the tower posts. The cell storage area 122 stores cells for the tower posts. The layout data storage area 123 reads layout data (generated when the automatic positioning process of the tower posts is completed by the processing unit 111) from the positioning-condition storage unit 112, and stores the layout data.

The input unit 130 is composed of a keyboard, a computer mouse or the like. The input unit 130 is used by a designer to input constraints, conditions or the like of the automatic positioning process of the tower posts.

The display unit 140 is composed of, for example, a cathode ray tube (CRT) or the like. The display unit 140 is used by the designer to check the result of the input by means of the input unit 130 and to check the result of the automatic positioning process of the tower posts (i.e., the final layout data stored in the positioning condition storage unit 112).

Figure 2:
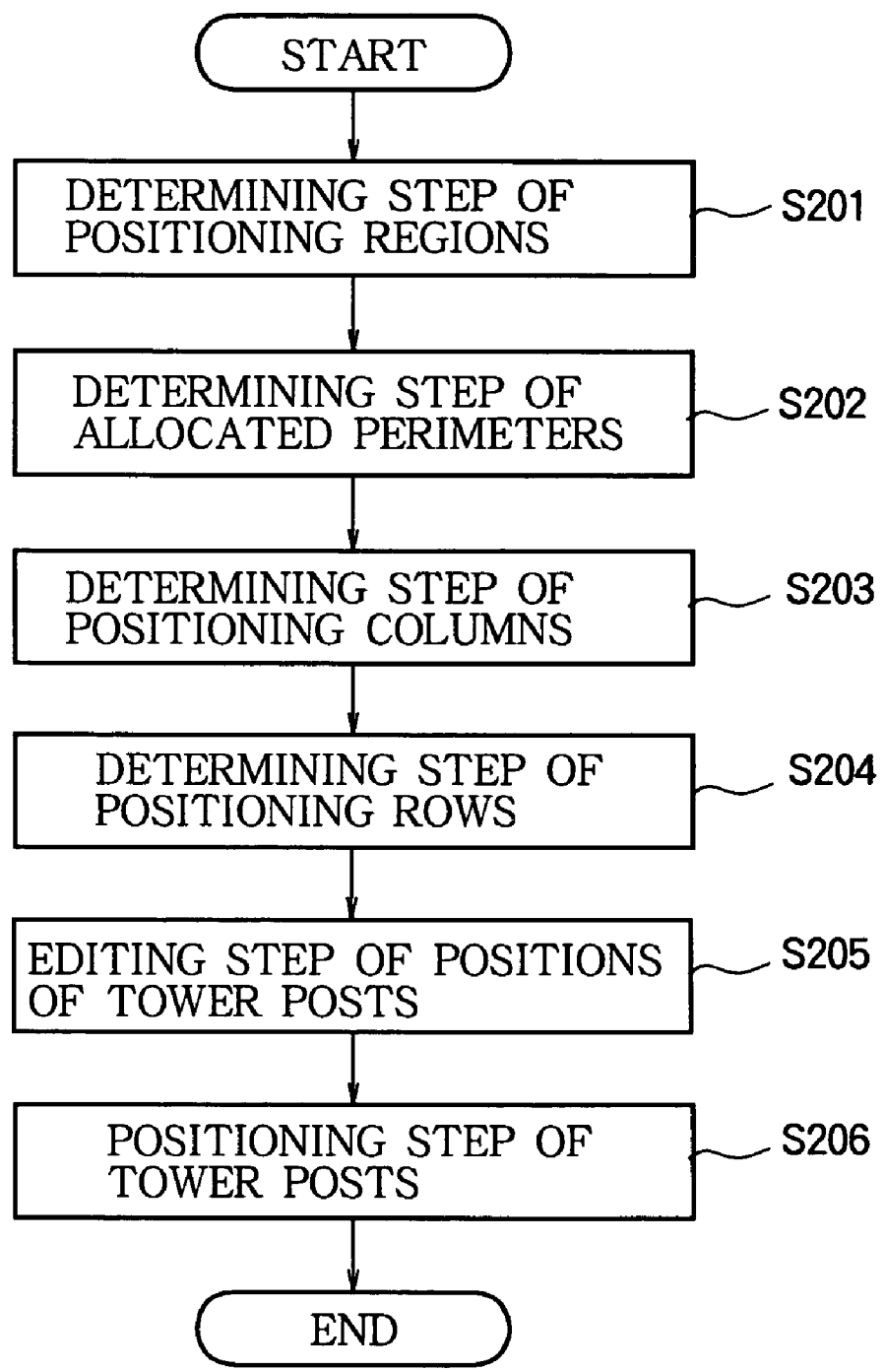
FIG. 2 is a flow chart illustrating an automatic positioning process of tower posts according to the embodiment of the present invention.

FIG. 2 is a flow chart illustrating the automatic positioning process of the tower posts according to the embodiment of the present invention.

As shown in FIG. 2, the automatic positioning process of the tower posts according to this embodiment includes a determining step of positioning sections (S201), a determining step of allocated perimeters (S202), a determining step of positioning columns (S203), a determining step of positioning rows (S204), an editing step of positions of tower posts (S205), and a positioning step of tower posts (S206).

The respective steps S201 through S206 will be described below.

Determining Step of Positioning Sections.

Figure 3:
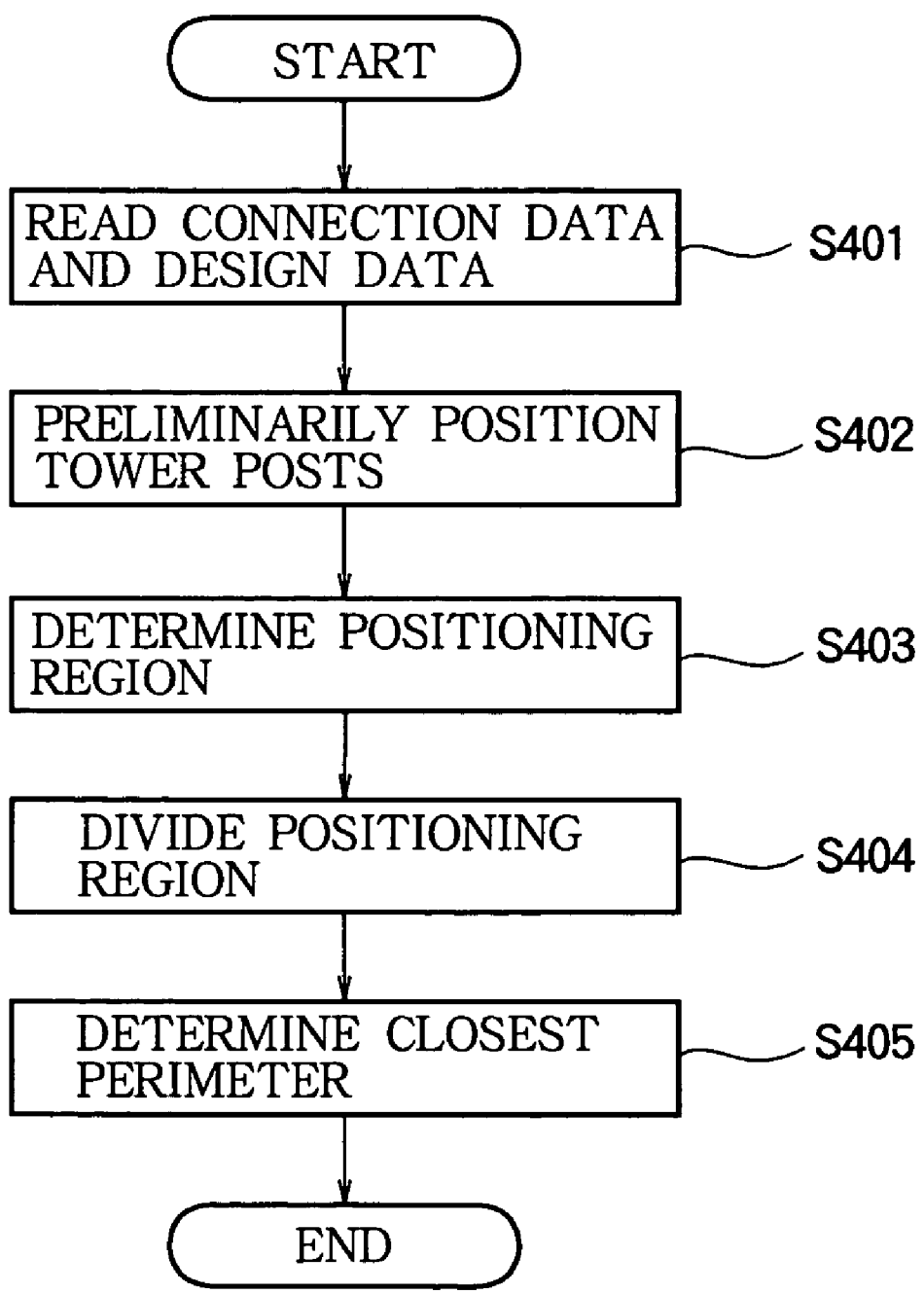
FIG. 3 is a flow chart illustrating a determining step of positioning sections according to the embodiment of the present invention.
Figure 4:
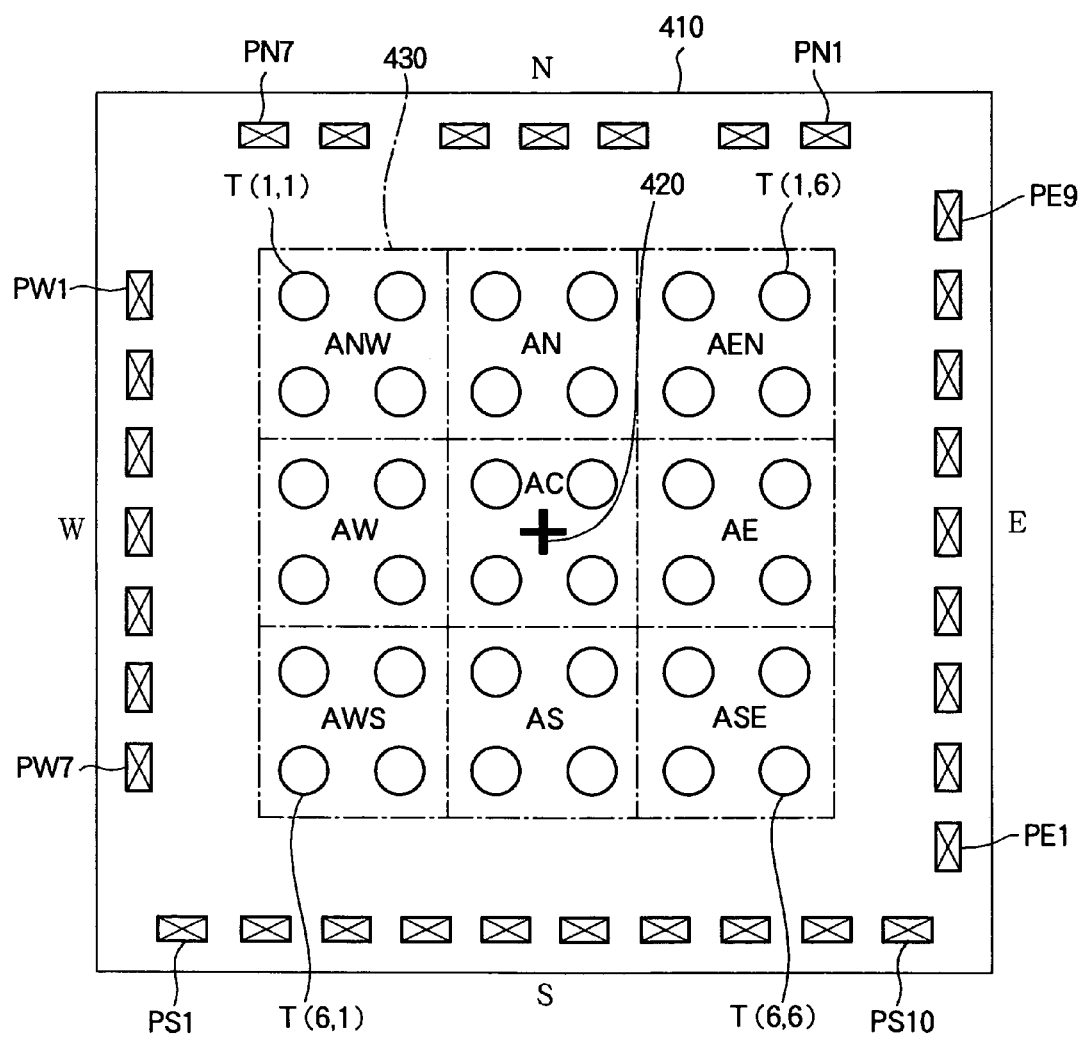
FIG. 4 is a schematic view illustrating a layout data of the determining step of positioning sections according to the embodiment of the present invention.

The determining step of positioning sections (step S201) will be described with reference to FIGS. 3 and 4. FIG. 3 is a flow chart illustrating the step S201. FIG. 4 is a schematic view illustrating a layout data when the step S201 is completed. In this step S201 (i.e., the determining step of positioning sections), the positions of the tower posts are determined, and then the positioning region of the tower posts is divided into a plurality of positioning sections. Further, the closest perimeter (among the perimeters or sides along which the pads are arranged) is assigned to each positioning section.

The processing unit 111 (FIG. 1) reads the connection data (i.e., the data representing the identifying numbers of the pads, the identifying numbers of the tower posts, and the connecting relationship between the pads and the tower posts) from the connection data storage area 121 of the external storage unit 120. The processing unit 111 further reads the design conditions (i.e., the data of the external shape of the W-CSP, the positioning interval of the tower posts, the numbers of rows and columns of the tower posts, or the like) from an external device (step S401 in FIG. 3).

In this embodiment, the numbers of the rows and columns of the tower posts are respectively set to 6 (i.e., the total number of the tower posts is 36). These numbers are merely examples, and it is apparent this embodiment is not limited to these numbers.

The processing unit 111 determines the center 420 of the surface (i.e., a surface on which the tower posts are placed) of the semiconductor chip 410 for manufacturing the semiconductor device of W-CSP structure. Then, the processing unit 111 preliminarily positions the tower posts T (1, 1) through T (6, 6) on the semiconductor chip (step S402), in accordance with the above described connection data and the design conditions. In this step, the processing unit 111 aligns the center of the arranged tower posts with the center 420 of the surface of the semiconductor chip, so that a positioning region 430 of the tower posts are determined. The processing unit 111 determines the positioning region 430 of the tower posts, according to the positions of the tower posts T (1, 1) through T (6, 6) or the like (step S403).

As shown in FIG. 4, pads PW1 through PW7 are arranged in the vicinity of a perimeter W of the semiconductor chip 410. Pads PS1 through PS10 are disposed in the vicinity of a perimeter S of the semiconductor chip 410. Pads PE1 through PE9 are disposed in the vicinity of a perimeter E of the semiconductor chip 410. Pads PN1 through PN7 are disposed in the vicinity of a perimeter N of the semiconductor chip 410. The positioning of the pads PW1 through PW7, PS1 through PS10 PE1 through PE9 and PN1 through PN7 is performed in a process prior to the automatic positioning process of the tower posts of this embodiment.

Then, the processing unit 111 divides the positioning region 430 into nine positioning sections AWS, AS, ASE, AE, AEN, AN, ANW, AW, AC (step S404). In this embodiment, areas of the nine positioning sections are the same. However, it is not necessary that the areas of the nine positioning sections are the same.

Further, the processing unit 111 determines the closest perimeter among the perimeters W, S, E, N for each positioning section (step S405). For the positioning section AW, the closest perimeter is the perimeter W facing the positioning section AW. For the positioning section AS, the closest perimeter is the perimeter S facing the positioning section AS. For the positioning section AE, the closest perimeter is the perimeter E facing the positioning section AE. For the positioning section AN, the closest perimeter is the perimeter N facing the positioning section AN. For the positioning section AWS, there are two closest perimeters W and S. For the positioning section ASE, there are two closest perimeters S and E. For the positioning section AEN, there are two closest perimeters E and N. For the positioning section ANW, there are two closest perimeters N and W. For the center positioning section AC, all perimeters W, S, E, N are determined to be the closest perimeters.

With this, the determining step of the positioning sections (step S201) is completed.

Determining Step of Allocated Perimeters.

Figure 5:
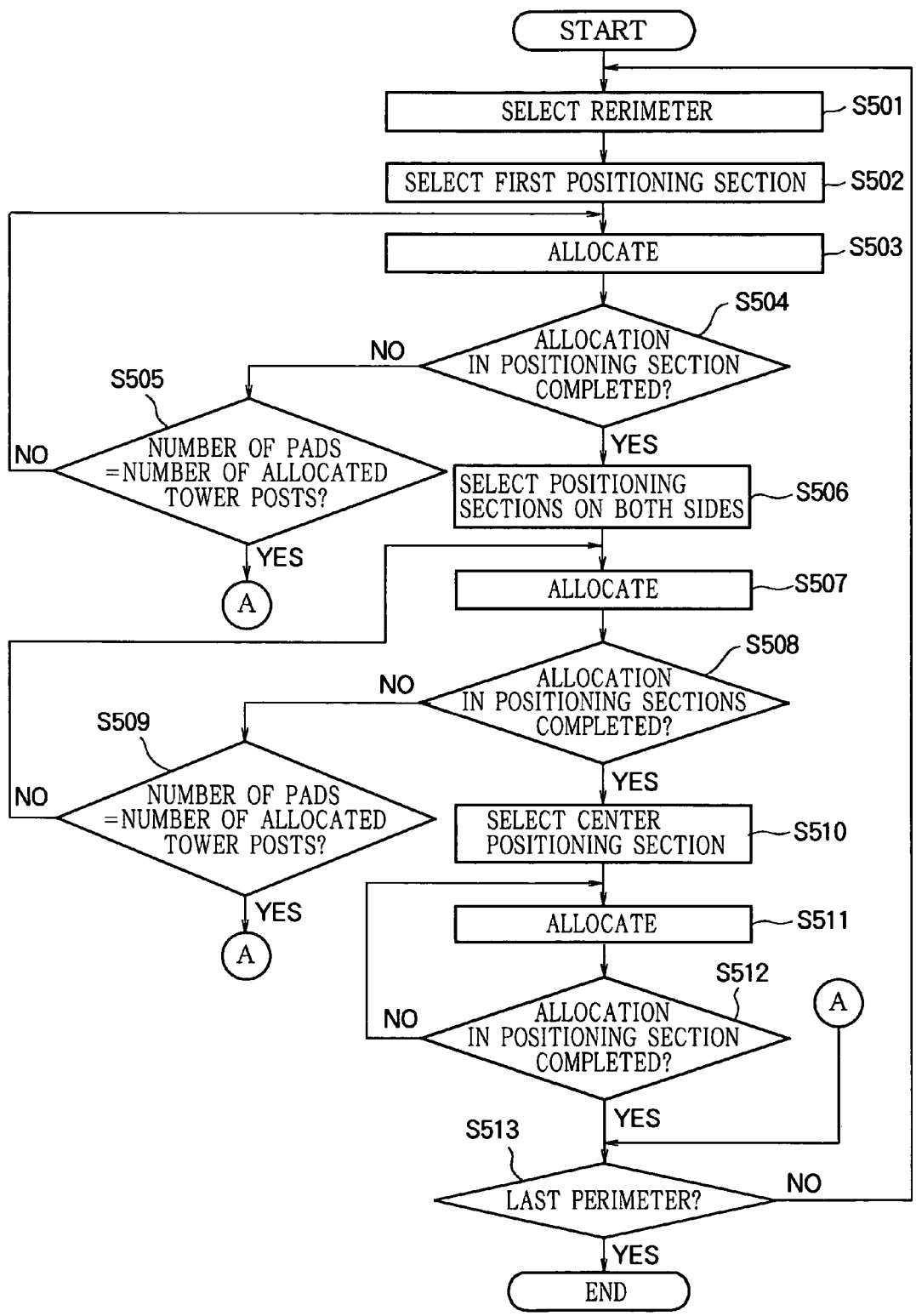
FIG. 5 is a flow chart illustrating a determining step of allocated perimeters according to the embodiment of the present invention.
Figure 6:
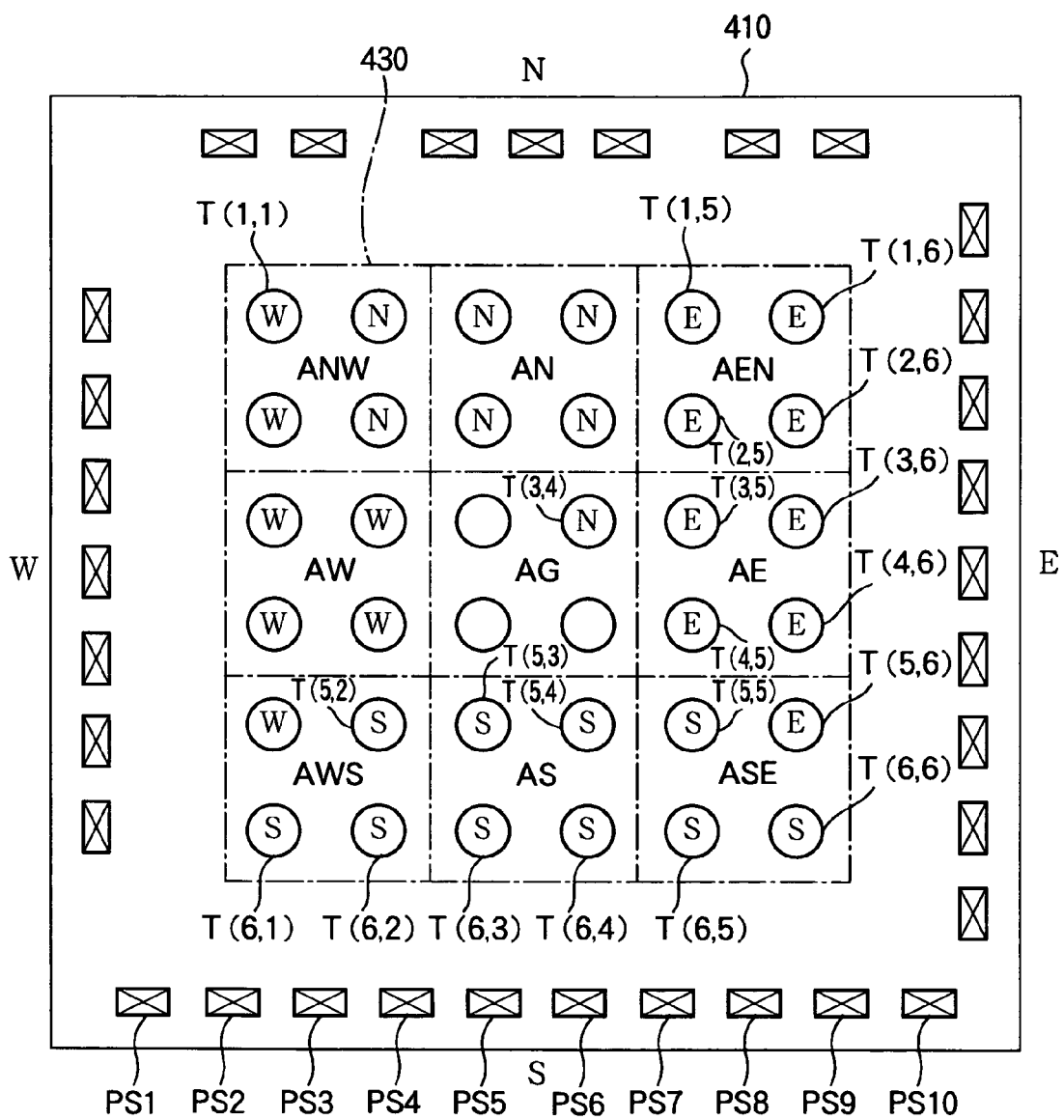
FIG. 6 is a schematic view illustrating a layout data of the determining step of allocated perimeters according to the embodiment of the present invention.

The determining step of allocated perimeters (step S202) shown in FIG. 2 will be described with reference to FIGS. 5 and 6. FIG. 5 is a flow chart showing the determining step of allocated perimeters (step S202). FIG. 6 is schematic view illustrating a layout data when the step S202 is completed. As described below, in the determining step of allocated perimeters (step S202), the tower posts in the positioning section facing only one closest perimeter are allocated to the closest perimeter. The tower posts in the positioning section facing two closest perimeters are allocated to one of two closest perimeters. This allocation is performed until the number of the allocated tower posts becomes the same as the number of the pads arranged along the perimeters. In the determining step of allocated perimeters (step S202), the allocation of the tower posts to the perimeters is performed, but the allocation of the tower posts to the respective pads is not performed.

In order to shorten the wiring length, it is preferable to perform the allocation in the order starting from the perimeter along which the largest number of tower posts are arranged. Further, in allocating the tower posts to each perimeter, it is preferable to perform the allocation in the order starting from the tower posts in the positioning section facing the smallest number of the closest perimeters (i.e., one perimeter).

The processing unit 111 selects one perimeter as the object of allocation (step S501 in FIG. 5). In this example, the perimeter S along which the largest number of pads are arranged is selected.

Then, the processing unit 111 selects one positioning section (as the object of allocation) facing the smallest number of the closest perimeters (step S502). In this example, the positioning section AS is selected among the four positioning sections AWS, AS, ASE, AC corresponding to the perimeter S.

The processing unit 111 allocates the tower posts in the positioning section AS to the perimeter S in the order starting from the tower post closest to the perimeter S (step S503). In this example, the tower posts T (6, 3), T (6, 4), T (5, 3) and T (5, 4) are selected in this order. When the processing unit 111 completes the allocation of the last tower post T (5, 4) in the positioning section AS, the allocation of the tower posts in the positioning section AS is finished (step S504). The allocation is continued until the number of allocated tower posts reaches the number of the pads arranged along the perimeter S. When the number of allocated tower posts reaches the number of the pads arranged along the perimeter S, the allocation of the tower post to the perimeter S is finished (step S505). In this case, since the number of the pads arranged along the perimeter S is 10 and the number of the tower posts in the positioning section AS is 4, all of the tower posts T (6, 3), T (6, 4), T (5, 3) and T (5, 4) in the positioning section AS are allocated to the perimeter S.

Then, the processing unit 111 selects the positioning sections (as the objects of allocation) on both sides of the positioning section having been selected (step S506) In this example, the positioning sections AWS and ASE on both sides of the positioning section AS are selected.

The processing unit 111 sequentially allocates the tower posts in the positioning sections AWS and ASE to the perimeter S (step S507). This allocation is performed in the order starting from the tower post closest to both the perimeter S and the positioning section AS and in the diagonal direction of the positioning region 430. In this embodiment, the tower post T (6, 2) is first selected, and then the tower post T (6, 5) is selected. Then, the tower posts T (6, 1), T (5, 2), T (6, 6) and T (5, 5) are selected in this order. As is the case with the allocation of the tower post in the positioning section AS, the allocation of the tower posts in the positioning sections AWS and ASE is completed when the last tower post in the positioning sections AWS and ASE are allocated to the perimeter S (step S508). If the number of the allocated tower posts reaches the number of the pads arranged along the perimeter S, the allocation of the tower posts to the perimeter S is completed (step S509). In this embodiment, when the last tower post T (5, 5) is allocated to the perimeter S, the total number of the allocated tower posts is 10. Therefore, the allocation of the tower post to the perimeter S is finished. The processing unit 111 skips the steps S510 to S512 and proceeds to step S513.

Then, the processing unit 111 checks whether the allocation to the all perimeters has been completed (step S514). In this example, the allocation to the perimeters E, N, W is not completed, and therefore the processing unit 111 returns to the step S501.

In the step S501, the processing unit 111 selects one perimeter as the object of allocation. In this example, the perimeter E along which the second largest number of pads are arranged is selected.

Then, the processing unit 111 selects the positioning section AE (as the object of allocation) among the positioning sections ASE, AE, AEN and AC corresponding to the perimeter E (step S502).

In the steps S503 through S505, the tower posts T (4, 6), T (3, 6), T (4, 5) and T (3, 5) are allocated to the perimeter E, as described above.

In the step S6, the processing unit 111 selects the positioning sections ASE and AEN (as the objects of allocation) on both sides of the positioning section AE having been selected.

In the step S507, the processing unit 111 sequentially allocates the tower posts in the positioning sections ASE and AEN to the perimeter E in a similar manner described above. The tower posts T (5, 5), T (6, 5), T (6, 6) having already been allocated to the perimeter S are not selected. In this example, the tower post T (5, 6) is first selected, and then the tower post T (2, 6) is selected. Further, the tower posts T (1, 6), T (2, 5) and T (1, 5) are selected in this order.

When the tower post T (1, 6) is allocated to the perimeter E, the number of the allocated tower posts (9) reaches the number of the pads arranged along the perimeter E, and therefore the allocation of the tower posts to the perimeter E is completed (step S509).

Then, the processing unit 111 checks whether the allocation of the tower posts to all the perimeters (step S514) has been completed. In this example, the allocation to the perimeters N and W is not completed, and therefore the processing unit 111 returns to the step S501.

In the step S501, the processing unit 111 selects the perimeter as the object of allocation. The number of the pads arranged along the perimeter N and the number of the pads arranged along the perimeter W are both 7, and therefore it is possible to select the perimeter N or the perimeter W in first. In this example, the perimeter W is selected.

The processing unit 111 performs the allocation of the tower posts in the positioning section AW to the perimeter W (in a similar manner to the allocation to the perimeter E). Further, the processing unit 111 performs the allocation of the tower posts in the positioning sections AWS and ANW to the perimeter W. When the tower post T (1, 1) is allocated to the perimeter W, the number of the allocated tower posts (7) reaches the number of the pads arranged along the perimeter E, and therefore the allocation to the perimeter E is finished (step S501).

Then, the processing unit 111 checks whether the allocation of the tower posts to all the perimeters (step S514) has been completed. In this example, the allocation to the perimeter N is not completed, and therefore the processing unit 111 returns to the step S501.

In the step S501, the processing unit 111 selects the perimeter N as the object of allocation. Then, the processing unit 111 performs the allocation of the tower posts in the positioning section AN to the perimeter N in a similar manner described above. Further, the processing unit 111 performs the allocation of the tower posts in the positioning sections AEN and ANW to the perimeter N. In this example, all of the tower posts in the positioning sections AEN and ANW are allocated to the perimeter N (step S508) before the number of the allocated tower posts reaches the number (7) of the pads arranged along the perimeter N (step S509).

Then, the processing unit 111 selects the positioning section AC (step S510). Further, the processing unit 111 allocates the tower post T (3, 4) to the perimeter N (step S511). Further, the processing unit 111 checks whether the allocation of all of the tower posts in the positioning section AC has been completed (step S512). In this state, the allocation of all of the tower posts in the positioning section AC is completed, and therefore the processing unit 111 proceeds to step S513. Since the allocation to the last perimeter N is completed, the determining step of allocated perimeters (step S202) is finished.

In FIG. 6, the numeral shown in each tower post indicates the perimeter to which the tower post is allocated.

Determining Step of Positioning Columns.

Figure 7:
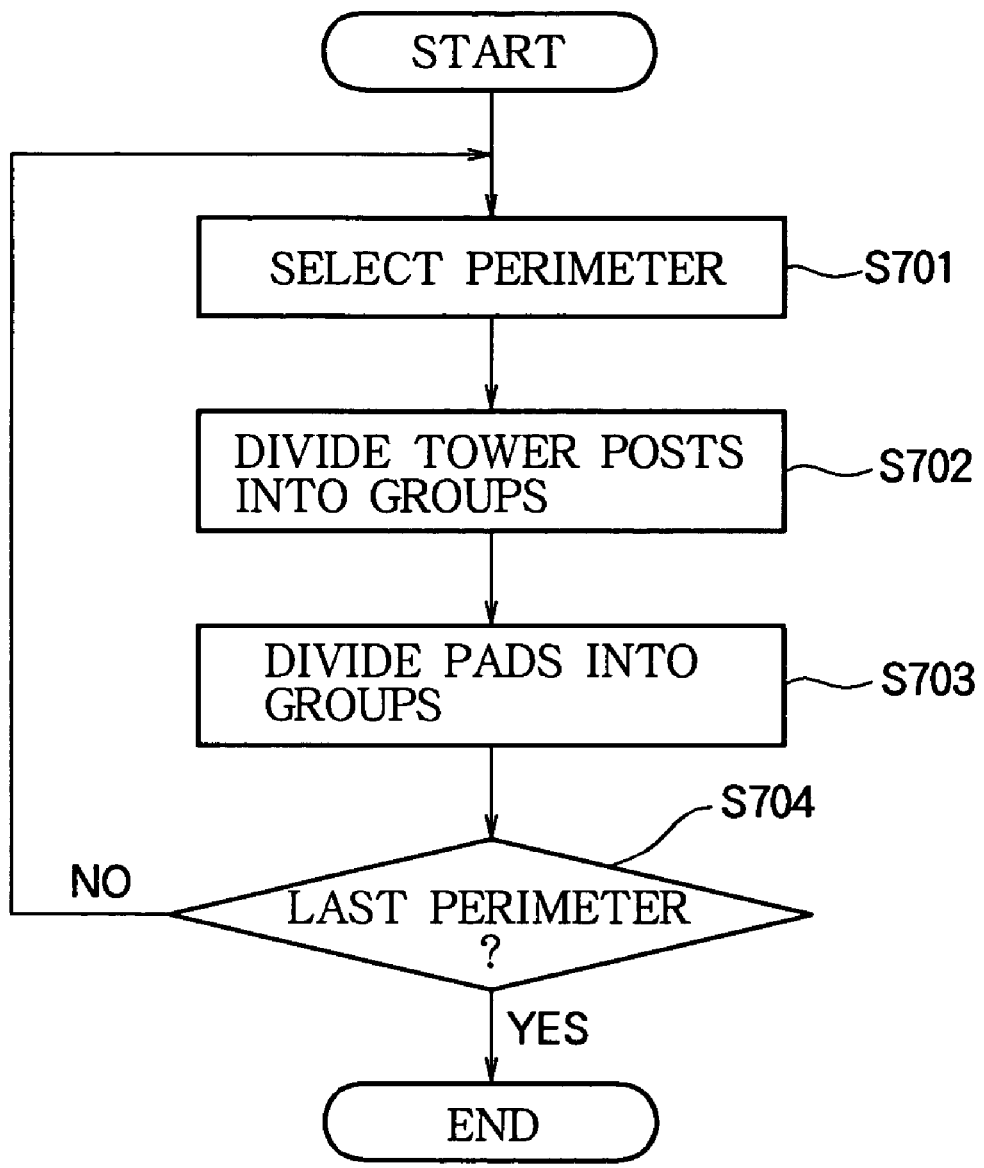
FIG. 7 is a flow chart illustrating a determining step of positioning columns according to the embodiment of the present invention.
Figure 8:
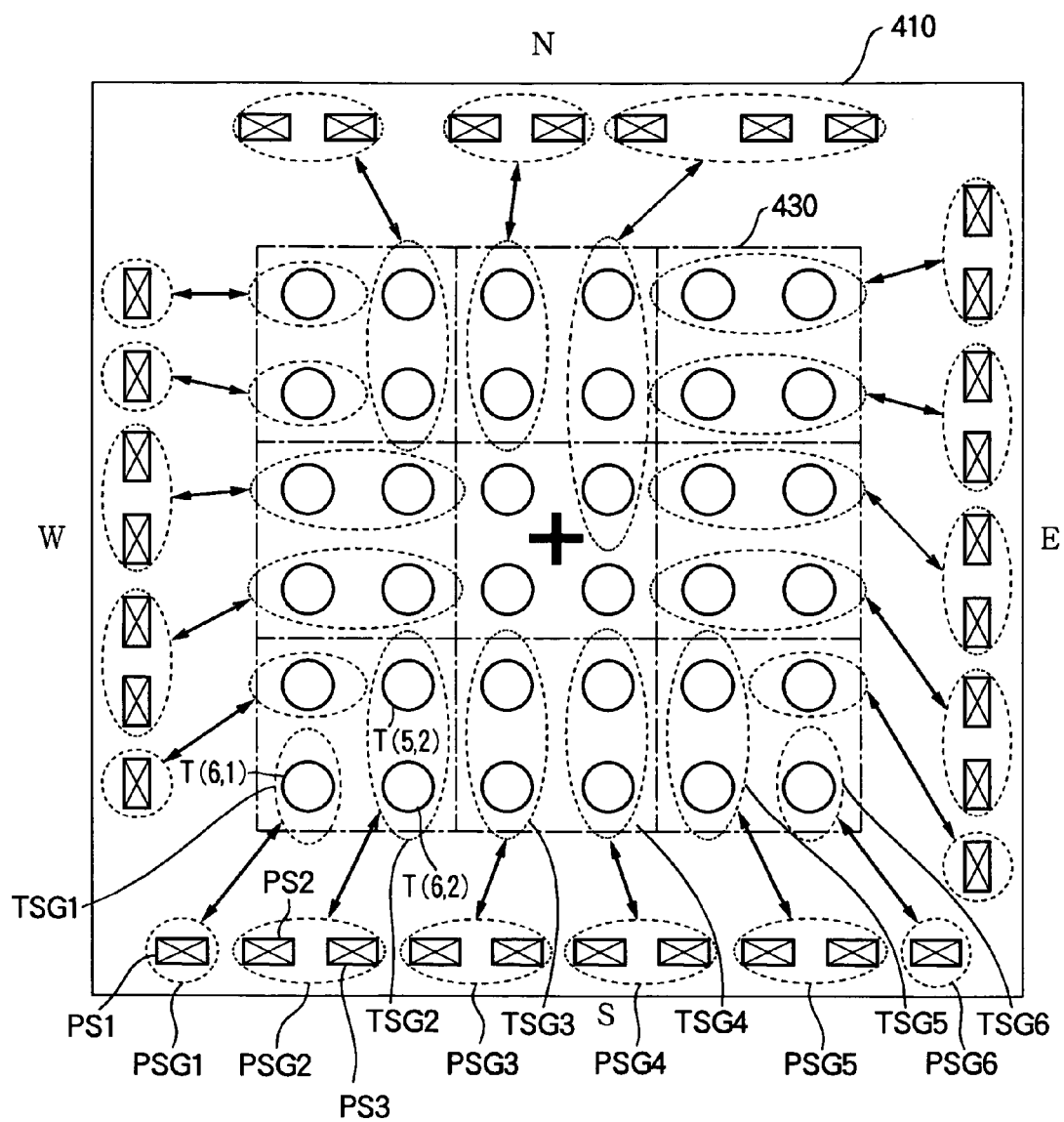
FIG. 8 is a schematic view illustrating a layout data of the determining step of positioning columns according to the embodiment of the present invention.

The determining step of positioning columns (step S203) shown in FIG. 2 will be described with reference to FIGS. 7 and 8. FIG. 7 is a flow chart illustrating the determining step of positioning columns (step S203). FIG. 8 is a schematic view illustrating a layout data when the step S203 is completed. As described below, in the determining step of positioning columns (step S203), the tower posts allocated to the same perimeter are grouped into groups arranged in the direction perpendicular to the perimeter. Further, according to the number of the tower posts of respective groups, the pads arranged along the perimeter is grouped into groups in the order from the endmost pad.

First, the processing unit 111 selects the perimeter as the object (step S701). In the determining step of positioning columns (step S203), the order of selection of the perimeters can be arbitrarily determined. In this example, the perimeter S is first selected.

Then, the processing unit 111 groups the tower posts allocated to the perimeter S (in the above described determining step of allocated perimeters S202) into groups arranged in the direction perpendicular to the perimeter S (i.e., the column direction), so as to define the groups TSG1 through TSG6 of the tower posts (step S702).

Further, the processing unit 111 groups the pads PS1 through PS10 along the perimeter S into groups in the order starting from one endmost pad (in this example, starting from the leftmost pad) (step S703). The numbers of the pads belonging to the respective pad groups are set to be the same as the numbers of the tower posts belonging to the corresponding tower post groups TSG1 through TSG6. For example, as the leftmost tower post group TSG1 includes one tower post T (6, 1), the corresponding pad group PSG1 includes one leftmost pad PS1. Next, second-to-leftmost tower post group TSG2 includes two tower posts T (5, 2) and T (6, 2), and the corresponding pad group PSG2 includes two pads PS2 and PS3. In such a manner, the pad groups PSG1 through PSG6 as shown in FIG. 8 are defined.

In this embodiment, the numbers 1 through 6 identifying the tower post groups TSG1 through TSG6 are referred to as "column-numbers" of the respective tower posts.

Then, the processing unit 111 checks whether the process for all of the perimeters has been completed (step S704), and repeats the steps S701 through S704 until the process for all of the perimeters is completed.

With such a process, the column-numbers of the respective tower posts are determined.

Determining Step of Positioning Rows.

Figure 9:
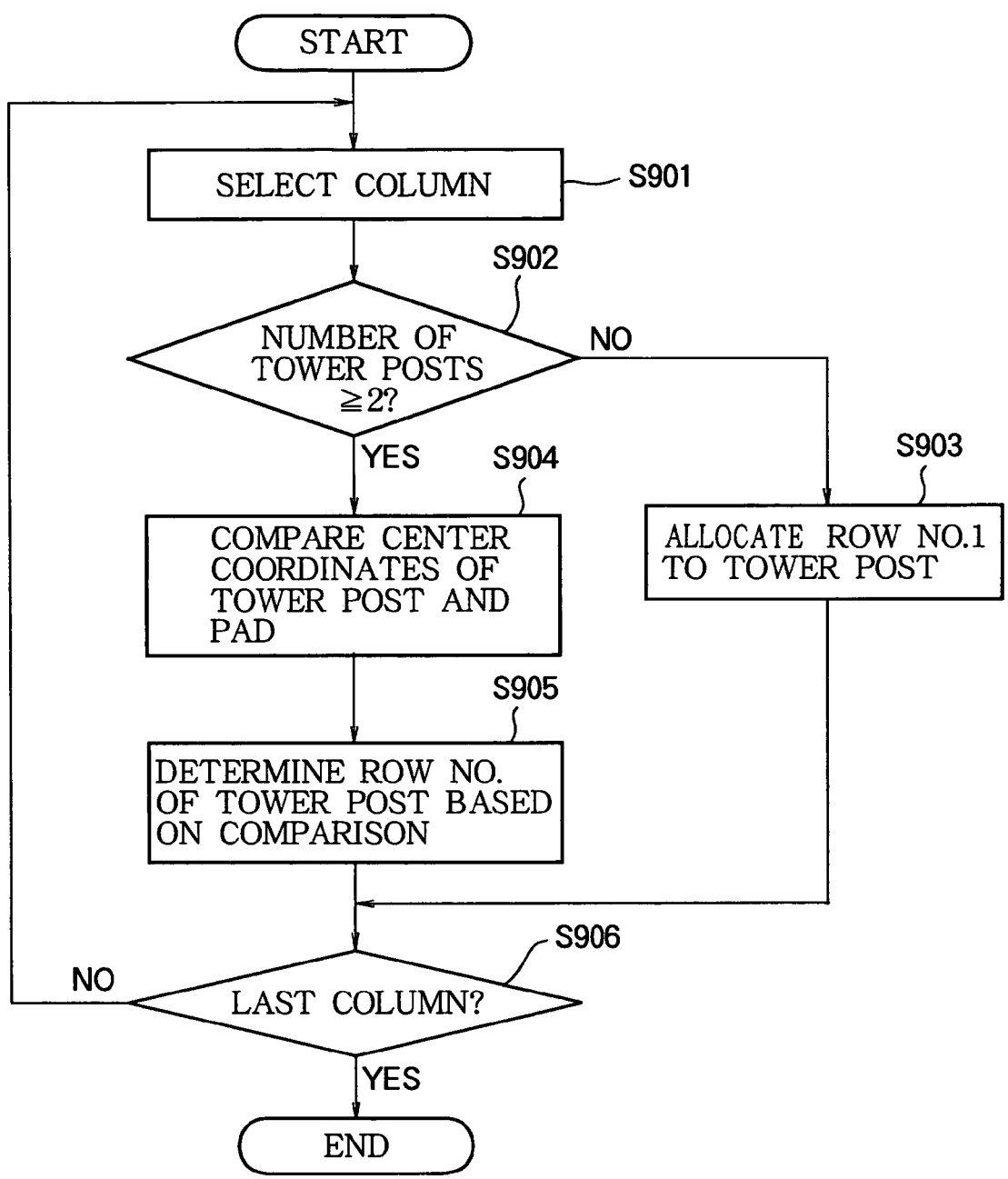
FIG. 9 is a flow chart illustrating a determining step of positioning rows according to the embodiment of the present invention.
Figure 10:
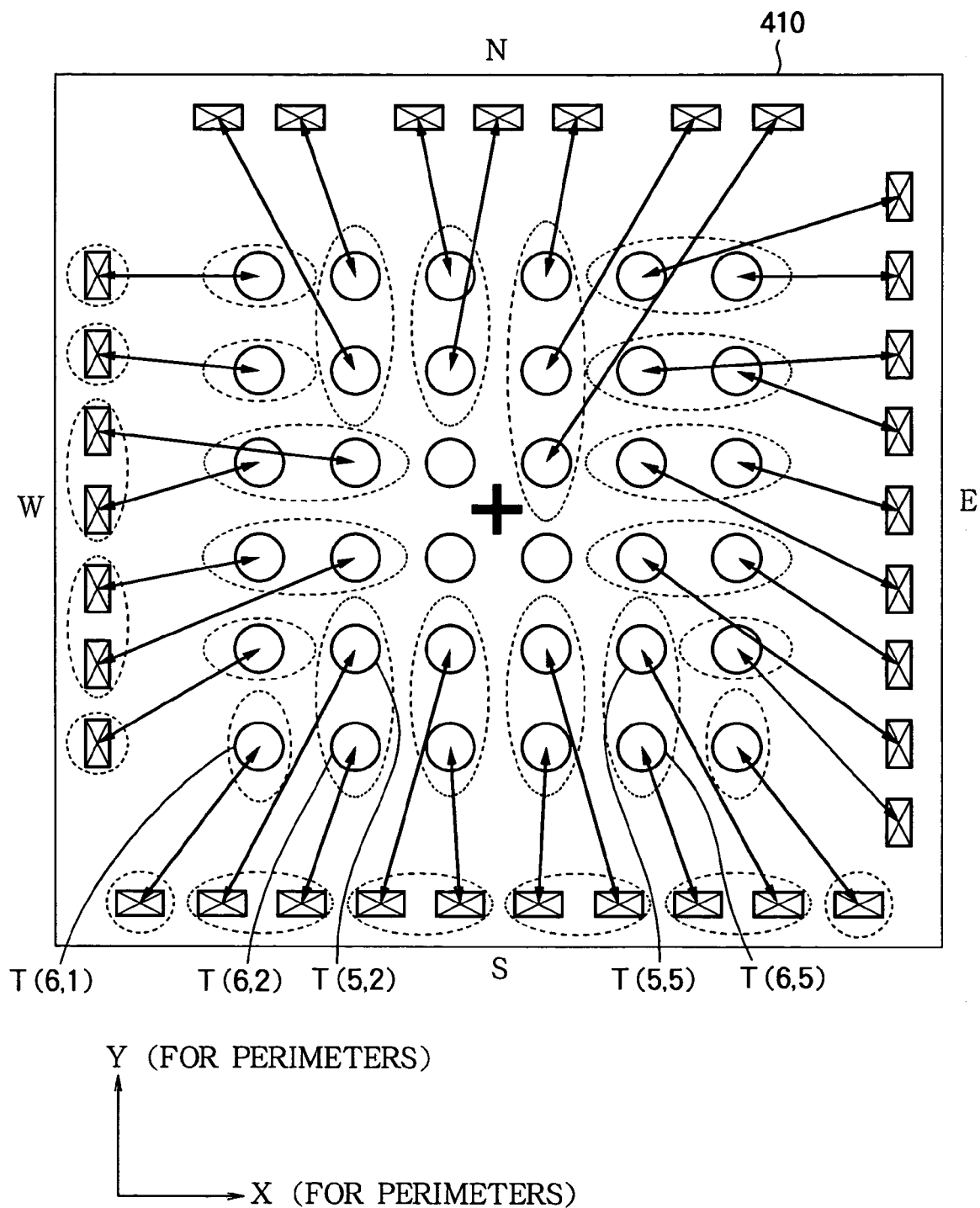
FIG. 10 is a schematic view illustrating a layout data of the determining step of positioning rows according to the embodiment of the present invention.

The determining step of positioning rows (step S204) shown in FIG. 2 will be described with reference to FIGS. 9 and 10. FIG. 9 is a flow chart illustrating the determining step of positioning rows (step S204). FIG. 10 is a schematic view illustrating a layout data when the step S204 is completed. As described below, in the determining step of positioning rows (step S204), the allocation of the tower posts (i.e., external terminals) to the pads is performed between the groups of the tower posts and the corresponding groups of the pads.

First, the processing unit 111 selects the column as the object of allocation (step S901). In the step S204, the order of the selection of the columns is arbitrary. In this example, the columns are selected in the order of the columns 1, 2, 3 . . .

The processing unit 111 checks the number of the tower posts corresponding to the selected column (step S902). If the number of the tower post is "1", the processing unit 111 assigns the row-number "1" to the tower post (step S903). In FIG. 10, the tower post T (6, 1) is assigned the row-number "1". Then, the processing unit 111 checks whether the column is the last column or not (step S906). If the column is not the last column, the processing unit 111 returns to the step S901.

In the step S902, if the number of the tower posts is 2 or more, the processing unit 111 checks the center coordinates of the tower posts and the center coordinates of the corresponding pads (step S904). In this example, x-coordinate is defined along the direction of the corresponding perimeter, and y-coordinate is defined along the direction perpendicular to the same perimeter (FIG. 10).

The pads whose x-coordinates are smaller than the tower posts (i.e., the pads located on the left side with respect to the corresponding tower posts) are allocated to the tower posts in the order in which the pad having smaller x-coordinate is allocated to the tower post having larger y-coordinate (i.e., the further tower post from the perimeter). Further, the tower posts are assigned the row-numbers 1, 2 . . . , in the order starting from the tower post allocated to the pad having the smallest x-coordinate. In the example shown in FIG. 10, the row-number "1" is assigned to the tower post T (6, 2), and the row-number "2" is assigned to the tower post T (5, 2).

In the step S904, the pads whose x-coordinates are larger than the tower posts (i.e., the pads located on the right side with respect to the corresponding tower posts) are allocated to the tower posts in the order in which the pad having larger x-coordinate is allocated to the tower post having larger y-coordinate (step S905). Further, the tower posts are assigned the row-numbers 1, 2 ..., in the order starting from the tower post allocated to the pad having the smallest x-coordinate. In the example shown in FIG. 10, the row-number "1" is assigned to the tower post T (6, 5), and the row-number "2" is assigned to the tower post T (5, 5).

When the processing unit 111 determines that the column is the last column at the step S906, the determining step of positioning rows (step S204) is completed.

Editing Step of Positions of Tower Posts.

Figure 11:
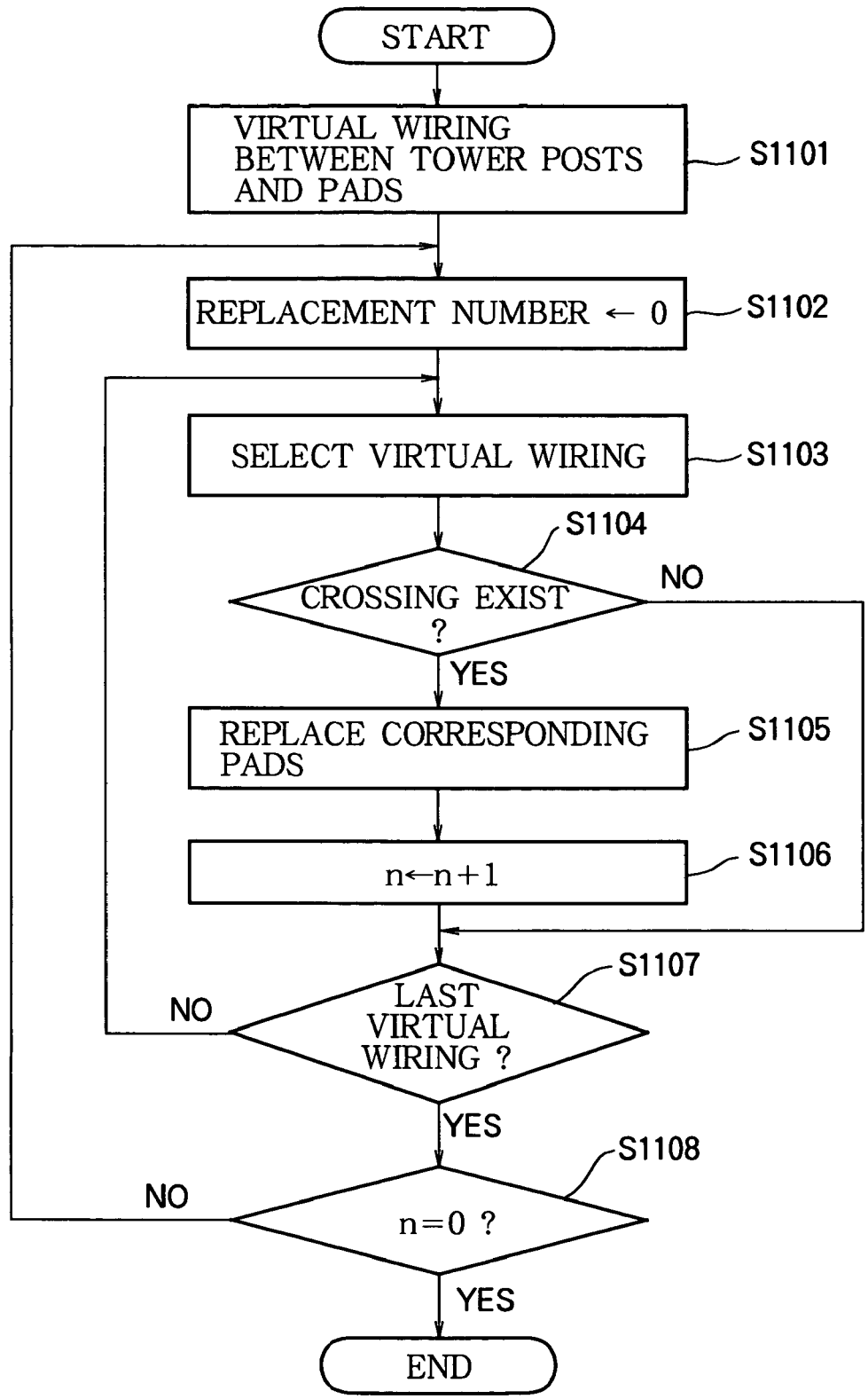
FIG. 11 is a flow chart illustrating an editing step of positions of tower posts according to the embodiment of the present invention.
Figure 12:
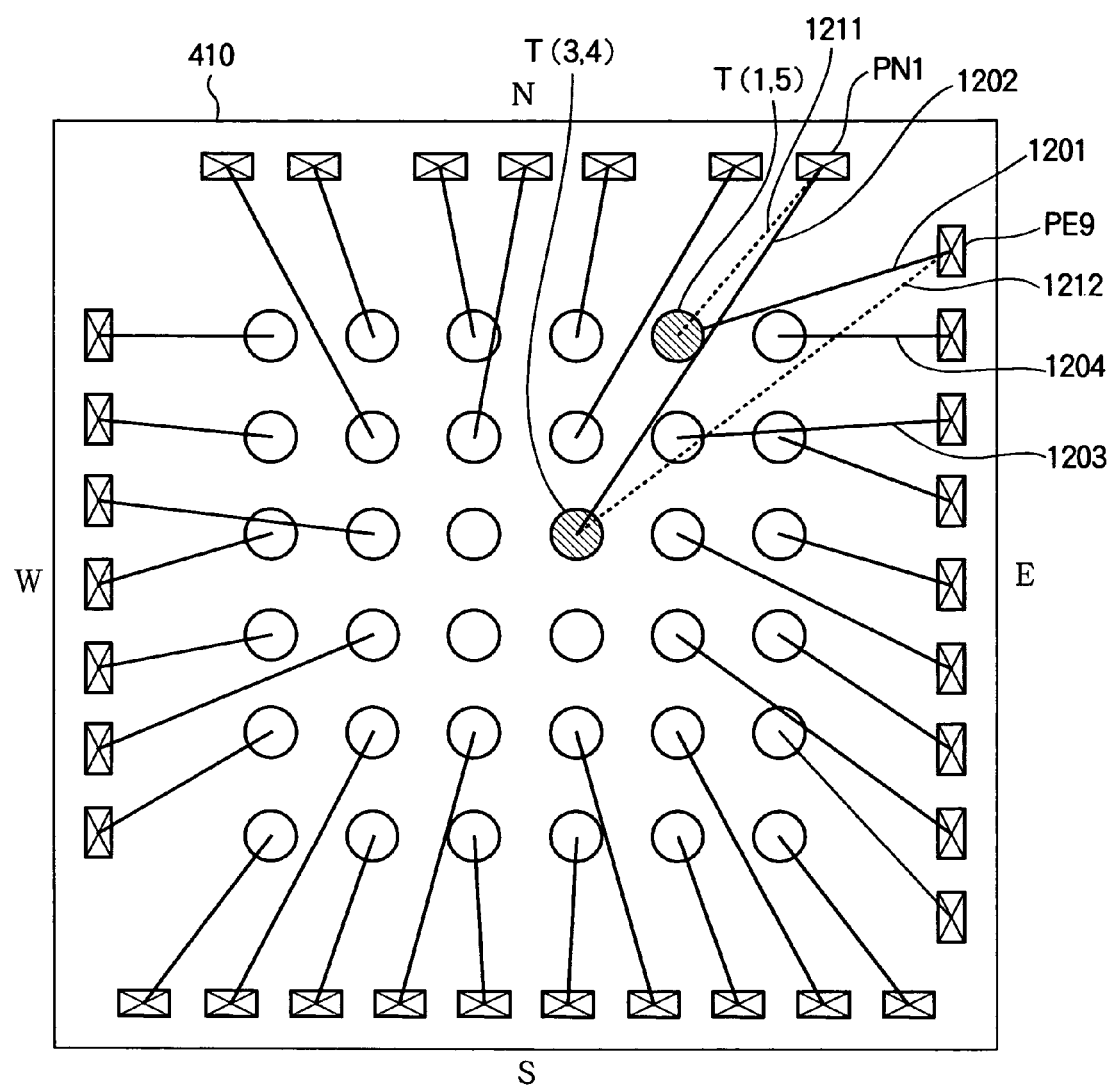
FIG. 12 is a schematic view illustrating a layout data of the editing step of positions of tower posts according to the embodiment of the present invention.

The editing step of positions of tower posts (step S205) shown in FIG. 2 will be described with reference to FIGS. 11 and 12. FIG. 11 is a flow chart illustrating the editing step of positions of tower posts (step S205). FIG. 12 is a schematic view illustrating a layout data when the step S205 is completed. In the editing step of positions of tower posts (step S205), the tower posts and the pads (allocated to each other in the above described step S204) are connected by means of linear virtual wirings. Further, it is checked whether the virtual wiring cross each other, and the crossing virtual wirings are replaced with each other.

First, the processing unit 111 connects the respective tower posts and the corresponding pads by means of the linear virtual wirings, in accordance with the row-numbers and the column-numbers of the tower posts (step s1101).

Then, the processing unit 111 substitutes "0" to a value "n" representing a replacement-number (step S1102), and selects the virtual wiring as the object of checking (step S1103). The checking of the virtual wirings can be performed in arbitrary order. For example, the checking can be started from the virtual wiring corresponding to the predetermined tower post in a clockwise or counterclockwise order.

The processing unit 111 checks the selected virtual wiring to determine whether the virtual wiring crosses any other virtual wiring (step S1104).

If the crossing of the virtual wirings is found, the processing unit 111 replaces the pads corresponding to the tower posts of the crossing virtual wirings with each other (step S1105). In the example shown in FIG. 12, the virtual wiring 1201 connecting the tower post T (1, 5) and the pad PE9 crosses the virtual wiring 1202 connecting the tower post T (3, 4) and the pad PN1. In such a case, the processing unit 111 replaces the corresponding pads PE9 and PN1. With such a replacement, the tower post T (1, 5) and the pad PN1 are connected to each other by new virtual wiring 1211, and the tower post (3, 4) and the pad PE9 are connected to each other by new virtual wiring 1212, with the result that the crossing is eliminated. Although the new virtual wiring 1212 crosses the virtual wirings 1203 and 1204, these crossings are eliminated by the following replacement process of the pads regarding the virtual wirings 1203 and 1204. When the replacement process is completed, the processing unit 111 adds "1" to the number of the replacement "n" (step S1106).

If the crossing is not found in the step S1104, the processing unit 111 skips the step S1105.

Then, the processing unit 111 checks whether the selected virtual wiring is the last virtual wiring (step S1107). If the selected virtual wiring is not the last virtual wiring, the processing unit 111 returns to the step S1103.

In the step S1107, if the processing unit 111 determines that the selected virtual wiring is the last virtual wiring, the processing unit 111 checks the replacement-number "n" (step S1108). If the replacement-number "n" is not 0, the processing unit 111 again substitutes 0 to the replacement-number "n" (step S1102), and repeatedly checks if there is a crossing of the virtual wirings starting from the first virtual wiring (steps S1103 through S1107). If the replacement-number "n" is 0, the processing unit 111 finishes the editing step of positions of the tower posts (step S205).

As described above, as the result of the replacement of the pads, there is a possibility that the new crossing of the virtual wirings is generated. Therefore, in the editing step of positions of the tower posts (step S205), the steps S1102 through S1107 are repeated until the replacement-number "n" is zero when the checking of the last virtual wiring is completed.

Positioning Step of Tower Posts.

Figure 13:
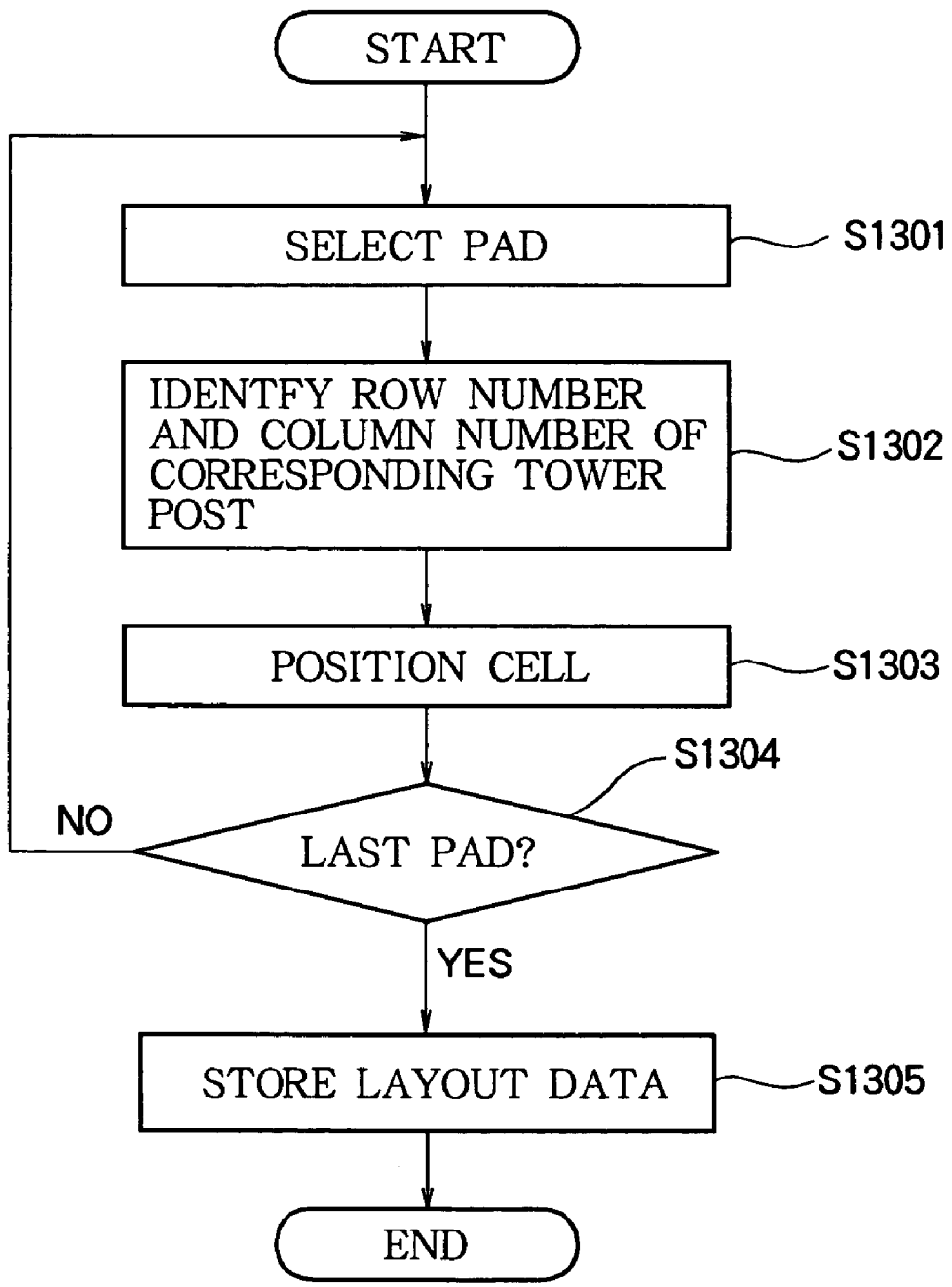
FIG. 13 is a flow chart illustrating a positioning step of tower posts according to the embodiment of the present invention.
Figure 14:
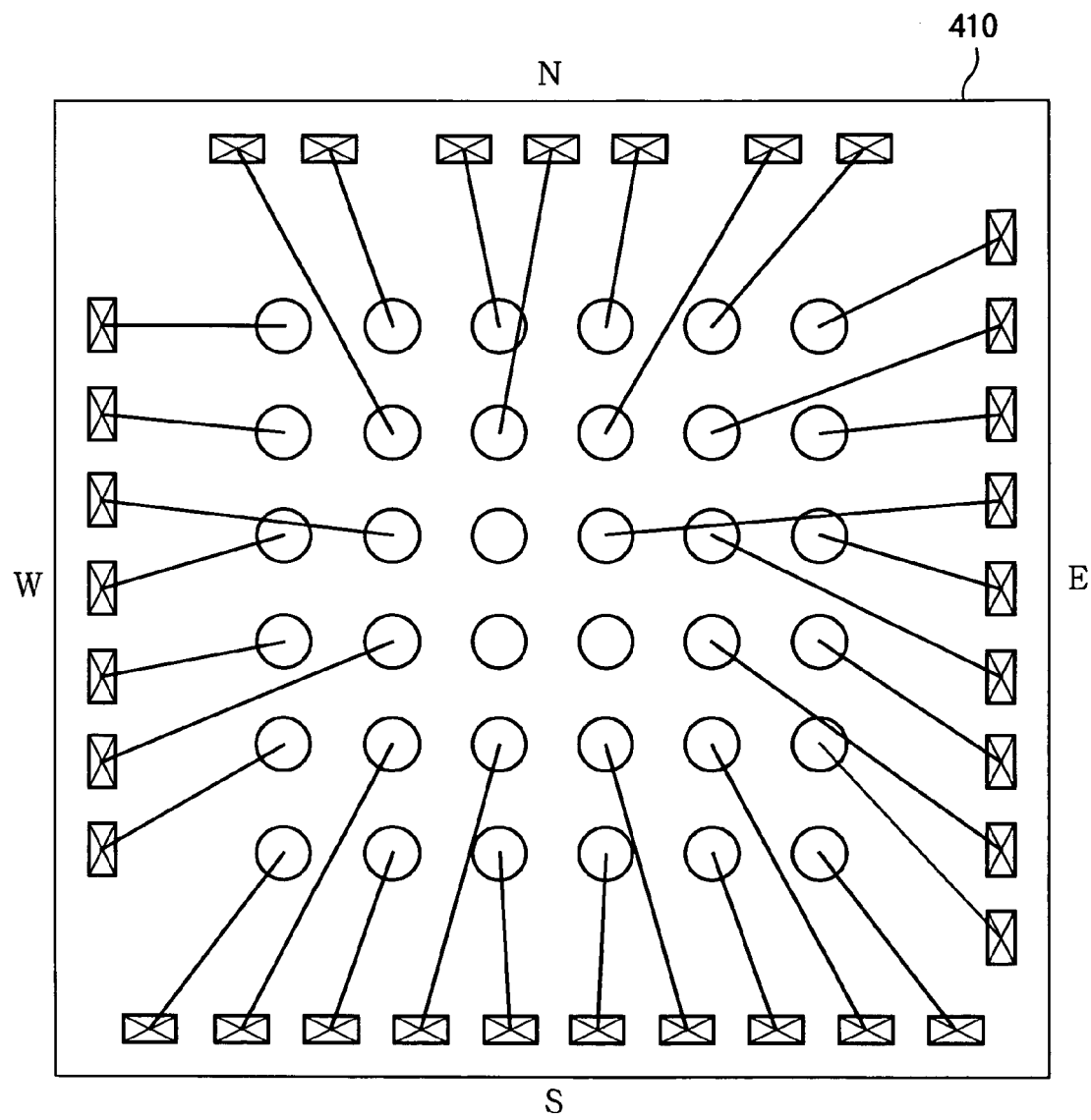
FIG. 14 is a schematic view illustrating a layout data of the positioning step of tower posts according to the embodiment of the present invention.

The positioning step of tower posts (step S206) shown in FIG. 2 will be described with reference to FIGS. 13 and 14. FIG. 13 is a flow chart showing the positioning step of tower posts (step S206). FIG. 14 is a schematic view illustrating a layout data when the step S206 is completed.

The processing unit 111 selects the pad as the object (step S1301). In the step S206, the selection of the pads can be performed in arbitrary order. For example, the pads can be selected in a counterclockwise order, starting from the pad having the smallest x-coordinate at the periphery S.

Then, the processing unit 111 identifies the row-number and the column-number of the tower post corresponding to the selected pad (step S1302). This identification can be performed by using, for example, the information temporarily stored in the positioning condition storing area 112 (FIG. 1).

Further, the processing unit 111 reads the tower post cell corresponding to the row-number and the column-number from the cell storage area 122 (FIG. 1) of the external storage unit 120, and positions the tower post cell to the layout (step S1303).

Then, the processing unit 111 checks whether the selected pad is the last pad or not (step S1304). The processing unit 111 repeats the steps 1301 through S1303 until the selected pad is determined to be the last pad.

In the step S1304, if the selected pad is determined to be the last pad, the processing unit 111 stores the completed layout data in the layout data storage area 123 (step S1305), and finishes the automatic positioning step of the tower posts.

The layout data stored in the layout data storage area 123 is read by other automatic designing device and used in the following automatic designing process.

As described above, according to the embodiment of the present invention, the respective tower posts are automatically positioned so that the respective tower posts are connected to the pads on the closest perimeter, and therefore it is possible to shorten the lengths of wirings that connect the tower posts and the pads.

Furthermore, according to the embodiment of the present invention, the tower posts located in a section facing two closest perimeters can be suitably allocated to one of the closest perimeters. Therefore, it is possible to reduce the limitation on the number of the pads arranged along each perimeter and the total number of the pads.

Moreover, according to the embodiment of the present invention, the tower posts and the pads are connected to each other by means of linear virtual wirings, and if the virtual wirings cross each other, the pads of the crossing virtual wirings are replaced with each other. Therefore, the automatic wiring can be accomplished by the single-layer wiring (without using the multi-layer wiring).

According to the embodiment of the present invention, the automatic design apparatus includes:

a determining unit of positioning sections that determines positions of the external terminals (i.e., tower posts), divides the positioning region into a plurality of positioning sections, and assigns at least one of the perimeters to each positioning section based on a positional relationship between the perimeters and the positioning sections;

a determining unit of allocated perimeters that allocates the external terminals in each positioning section to a corresponding perimeter to which the positioning section is assigned or to one of corresponding perimeters if a plurality of corresponding perimeters are assigned to the positioning section, until the number of the external terminals allocated to the perimeters reaches the number of the pads arranged along the perimeters;

a determining unit of positioning columns that divides the external terminals allocated to each perimeter into groups arranged in a direction perpendicular to the perimeter to which the external terminals are allocated, and divides the pads arranged along each perimeter into groups according to the number of the external terminals of the corresponding groups, starting from an endmost pad arranged along each perimeter;

a determining unit of positioning rows that assigns the external terminals of the groups to the pads of corresponding groups; and an editing unit of positions of external terminals that connects the external terminals and the pads assigned to each other by means of linear virtual wirings, checks whether the virtual wirings cross each other, and replacing correspondences between the external terminals and the pads of crossing virtual wirings with each other if there are crossing virtual wirings.

In the embodiment of the present invention, the automatic positioning unit 110 (FIG. 1) functions as the determining unit of positioning sections, the determining unit of allocated perimeters, the determining unit of positioning columns, the determining unit of positioning rows, and the editing unit of positions of external terminals.

Further, the determining unit of positioning sections can be configured to divide the positioning region into square positioning sections arranged in three rows or more and three columns or more.

Furthermore, the determining unit of allocated perimeters can be configured to perform allocation of the external terminals in the order starting from the perimeter along which the largest number of pads are arranged.

Moreover, the determining unit of allocated perimeters can be configured to perform allocation of the external terminals in the positioning section facing one closest perimeter, and to perform allocation of the external terminals in the positioning section facing a plurality of closest perimeters in the order starting from the external terminal closest to both perimeters and in a diagonal direction of the positioning section.

Additionally, the editing unit of positions of external terminals can be configured to repeatedly change correspondences between the external terminals and the pads of the crossing virtual wirings, until crossings of the virtual wirings is eliminated.

While the preferred embodiments of the present invention have been illustrated in detail, it should be apparent that modifications and improvements may be made to the invention without departing from the spirit and scope of the invention as described in the following claims.

What is claimed is:

1. An automatic design method for automatically positioning external terminals of a semiconductor device, said external terminals being provided on a semiconductor chip having pads and having peripheral sides, said automatic design method comprising the steps of:

determining positioning sections of said external terminals by provisionally determining positions of said external terminals, dividing a positioning region into a plurality of said positioning sections, and assigning at least one side to each positioning section based on a positional relationship between said sides and said positioning sections;

determining allocated sides by allocating said external terminals in each positioning section to a corresponding side to which said positioning section is assigned or to one of corresponding sides if a plurality of corresponding sides are assigned to said positioning section, until the number of said external terminals allocated to said sides reaches the number of said pads arranged along said sides;

determining positioning columns by grouping said external terminals allocated to each side into groups arranged in a direction perpendicular to said side to which said external terminals are allocated, and grouping said pads arranged along each side into groups according to the number of said external terminals of corresponding groups, starting from an endmost pad arranged along each side;

determining positioning rows by assigning said external terminals of said groups to said pads of corresponding groups; and editing positions of said external terminals by connecting said external terminals and said pads assigned to each other by means of linear virtual wirings, checking whether said virtual wirings cross each other, and replacing correspondences between said external terminals and said pads of crossing virtual wirings with each other if there are crossing virtual wirings.

2. The automatic design method according to claim 1 wherein, in said step of determining positioning sections, said positioning region is divided into square positioning sections arranged in three rows or more and three columns or more.

3. The automatic design method according to claim 1, wherein, in said step of determining allocated sides, said external terminals are allocated to said sides in the order starting from said side on which the largest number of pads are arranged.

4. The automatic design method according to claim 1, wherein said step of determining allocated sides comprises:

allocating said external terminals positioned in said positioning section facing one closest side; and allocating said external terminals positioned in said positioning section facing a plurality of closest sides, in the order starting from said external terminal closest to both sides and in a diagonal direction of said positioning section.

5. The automatic design method according to claim 1, wherein said step of editing positions of external terminals includes the step of repeatedly changing correspondences between said external terminals and said pads of said crossing virtual wirings, until crossings of said virtual wirings is eliminated.

* * * * *